US006338395B1

(12) United States Patent
Setiabudi et al.

(10) Patent No.: US 6,338,395 B1
(45) Date of Patent: Jan. 15, 2002

(54) KAPOK LOUDSPEAKER ENCLOSURE DAMPING MATERIAL

(75) Inventors: J. Dwidjaja Setiabudi; Adisusanto; Setiawan Yusran; Nafis Dwi CW; Sutarno, all of Kudas (ID)

(73) Assignee: P.T. Hartono Istana Electronics, Kudus (ID)

( * ) Notice: Subject to any disclaimer, the term of this patent is extended or adjusted under 35 U.S.C. 154(b) by 0 days.

(21) Appl. No.: 09/408,445

(22) Filed: Sep. 29, 1999

(51) Int. Cl.[7] .................................................. H05K 5/00
(52) U.S. Cl. ....................................... 181/151; 181/199
(58) Field of Search ................................ 181/282, 264, 181/199, 198, 151, 153, 294, 295, 296, 284

(56) References Cited

U.S. PATENT DOCUMENTS

| | | | | |
|---|---|---|---|---|
| 3,890,474 A | * | 6/1975 | Glicksberg | 179/107 E |
| 4,044,855 A | * | 8/1977 | Kobayashi | 181/151 |
| 4,101,736 A | * | 7/1978 | Czerwinski | 179/1 E |
| 4,128,738 A | * | 12/1978 | Gallery | 179/1 E |
| 4,429,762 A | * | 2/1984 | Cesati | 181/159 |
| 4,569,414 A | * | 2/1986 | Fulton | 181/156 |
| 5,333,204 A | * | 7/1994 | Hamada et al. | 381/158 |
| 5,712,038 A | * | 1/1998 | Yamazaki et al. | 428/411.1 |

OTHER PUBLICATIONS

TPI, Textil Praxis International, Jan./Feb. 1994, p. 68.*
USDA Forest Service, Forest Products Laboratory; Ceiba: Wood Technical Fact Sheet.*
Anguilla Beach Shack, Mary Ann's Tropical Construction Home Page; Ceiba.*

* cited by examiner

*Primary Examiner*—Robert E. Nappi
*Assistant Examiner*—Edgardo San Martin
(74) *Attorney, Agent, or Firm*—Birch, Steward, Kolasch & Birch, LLP

(57) ABSTRACT

A damping material for use in a loudspeaker enclosure to enhance sonic properties of the enclosure. The material for use in the enclosure is kapok, a fibrous material with a relatively low density. By incorporating the kapok within the enclosure, either standing alone or in combination with other materials known to function as acoustic dampers, the overall result is that the sonic quality of the speaker system is increased and may also be reduced in size without sonic compromise.

14 Claims, 3 Drawing Sheets

KAPOK LOUDSPEAKER ENCLOSURE DAMPING MATERIAL

FIELD OF THE INVENTION

The present invention relates to a loudspeaker enclosure material suitable for enhancing the performance of a loudspeaker and more particularly, the present invention relates to the use of a specific natural material for reducing internal resonance or standing waves as well as loudspeaker resonance.

BACKGROUND OF THE INVENTION

It has been well documented that various acoustic absorbing materials provide use in damping internal distortion within a speaker enclosure as well as enhance the sound quality and efficiency of the speaker system. In instances where standing waves are not damped, the internal reflections produce strong sonic colorations and thus sound quality. A further advantage associated with the use of damping material is that corporation of such material within the enclosure decreases the enclosure frequency resonance and thus produces more sonically desirable bass.

Damping materials which have proved to be suitable for achieving acoustic damping include glasswool, DACRON™, acoustic foam and other synthetic materials. The problem with these materials is that many of them are fairly expensive and can thus add to the manufacturing costs of the loudspeaker unit.

It would be desirable if an acoustic damping material were provided that was inexpensive, achieve the desirable results of damping internal vibration, enhancing bass and enhancing overall performance of the speaker were available. The present invention satisfies this need and provides such a material.

SUMMARY OF THE INVENTION

One object of the present invention is to provide an acoustic damping material which does not suffer from the limitations of the known art.

A further object of one embodiment of the present invention is to provide a sound attenuating material suitable for use in a loudspeaker enclosure, comprising kapok material, the kapok for reducing enclosure resonance and driver resonance.

The use of the kapok material is an alternative material that comes from the seed of kapok trees *"Ceiba pentandra"*. This material is a natural fibrous material and is relatively inexpensive. The kapok material also has a very low density and thus is ideal for acoustic damping. By selection of the appropriate amount of kapok, the result is lower resonance within the enclosure. It has been found that by making use of the kapok that the resonance is greatly reduced relative to other materials. In addition, the kapok is essentially uninfluenced by the heat generated within the enclosure as the speaker drivers are used. This is in marked contrast to synthetic materials, particularly acoustic foam, which inherently would experience property changes due to thermal degradation.

A further object of one embodiment of the present invention is to provide a loudspeaker enclosure having reduced internal resonance, comprising;

- a loudspeaker enclosure having a plurality of walls forming an enclosure;
- a loudspeaker driver mounted to one of walls; and
- kapok material positioned within the enclosure for reducing internal frequency resonance of the enclosure and resonance of loudspeaker.

The kapok has proven particularly successful in closed box systems, vented box systems, passive radiators, transmission line systems and other sub-woofer boxes, such as bandpass enclosures. Excellent results have also been obtained by making use of kapok in television loudspeaker driver enclosures as well as single driver enclosures and multiple driver enclosures.

In accordance with a further object of the present invention, there is provided a method of reducing internal resonance in a loudspeaker enclosure, comprising:

- providing a loudspeaker enclosure having a plurality of walls and at least one loudspeaker driver mounted therein;
- providing kapok material; and
- positioning the kapok material within the enclosure, whereby internal resonance of the enclosure is reduced relative to an enclosure absent the kapok.

Generally speaking, the positioning of the kapok will be in opposition to the wall mounting the loudspeaker driver. This will result in the reduction of standing waves and other intermodular distortions.

Having thus described the invention, reference will now be made to the accompanying drawings illustrating preferred embodiments.

BRIEF DESCRIPTION OF THE DRAWINGS

Similar numerals in the figures denote similar elements.

DETAILED DESCRIPTION OF THE PREFERRED EMBODIMENTS

Figure 1:
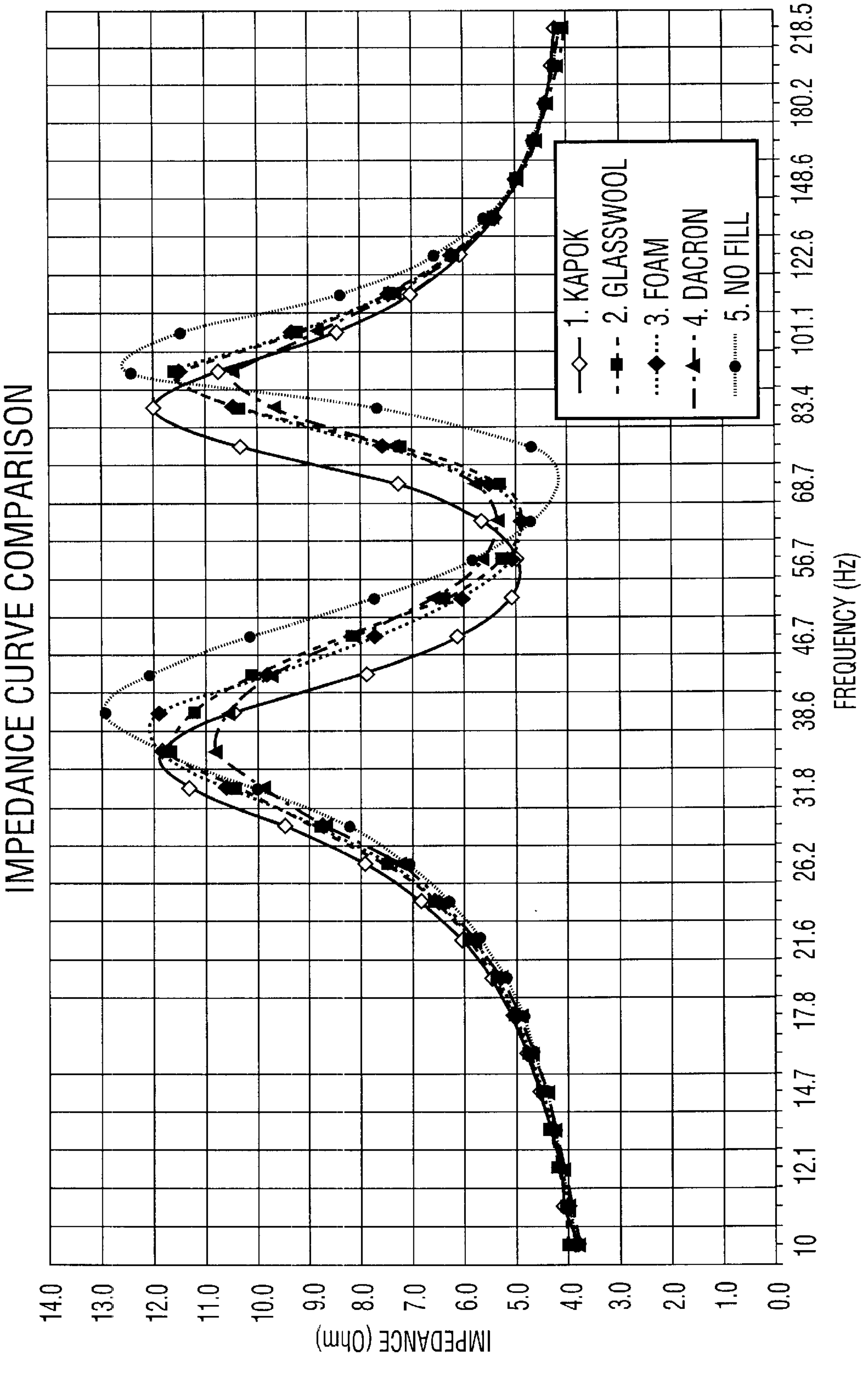
FIG. 1 is a graphically representation of an impedance curve comparison between an enclosure lacking damping material and an enclosure including various forms of damping material.

Referring initially to FIG. 1, a common enclosure volume was employed for all curves represented in FIG. 1 and accordingly, internal volume does not, therefore, present itself as a variable for the determination of the properties. Curve 5 represents the output generated for an enclosure containing no fill material. Curve 1 represents the data generated for the kapok lining in accordance with the present invention. Curve 2 represents the data for a glasswool filling. Curve 3 represents the data for a foam filling. Curve 4 represents the data generated for a Dacron™ containing enclosure and curve 5 represents the output generated for an enclosure containing no fill material. As is evident, the kapok lining generates the lowest box frequency ($f_H$) and the lowest driver resonance ($f_L$). This also represents the lowest system frequency with the driver and enclosure working together, generally represented by ($f_M$). This data is generally illustrated in Table 3 which demonstrates impedance as a function of frequency.

With respect to the data set forth in FIG. 1, the amount of material used to generate the data in FIG. 1 varied from the following amounts: 35 g to 70 g at 5.8 liter box volume. The amount of filler should be selected to achieve the lowest enclosure resonance and optimum speaker efficiency.

Figure 2:
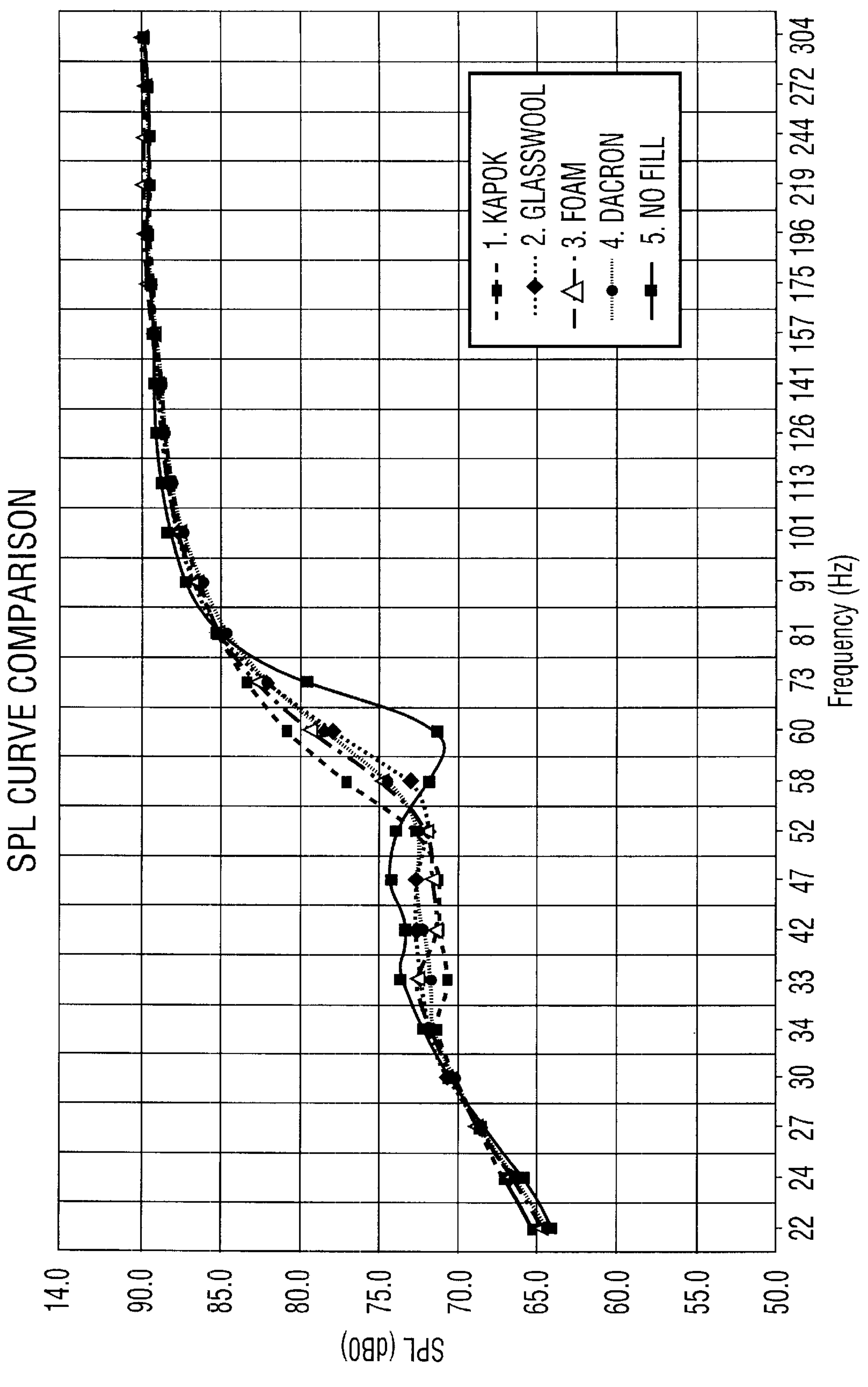
FIG. 2 is a graphical representation of the SPL curve comparison between a box without damping material and that which includes the damping material of the present invention as well as other damping materials for comparison.

Turning now to FIG. 2, as is evident, the use of the kapok material produced the highest sound pressure level (SPL) at various frequencies. This is tabulated in Table 1 which demonstrates the frequency and sound pressure level for the various materials. Table 2 sets forth the difference between sound pressure levels for various materials.

It has been found that the use of the kapok material can be useful to reduce enclosure size and optimize speaker efficiency. It has been found that for the purposes of the data generated in FIGS. 1 and 2 that the preferred density of kapok may be within the range of 2.2 grams per liter and 20.5 grams per liter. In the event that the kapok is mixed with an additional material such as rag cloth, the density can then be within the range of 2.0 grams per liter to about 16.3 grams per liter. In the instance where the kapok is mixed with acoustic foam, the density may be in the range of 1.3 grams per liter to 11.8 grams per liter and with acoustic foam and DACRON™, the density may range from 1.1 grams per liter to about 10.3 grams per liter.

Figure 3:
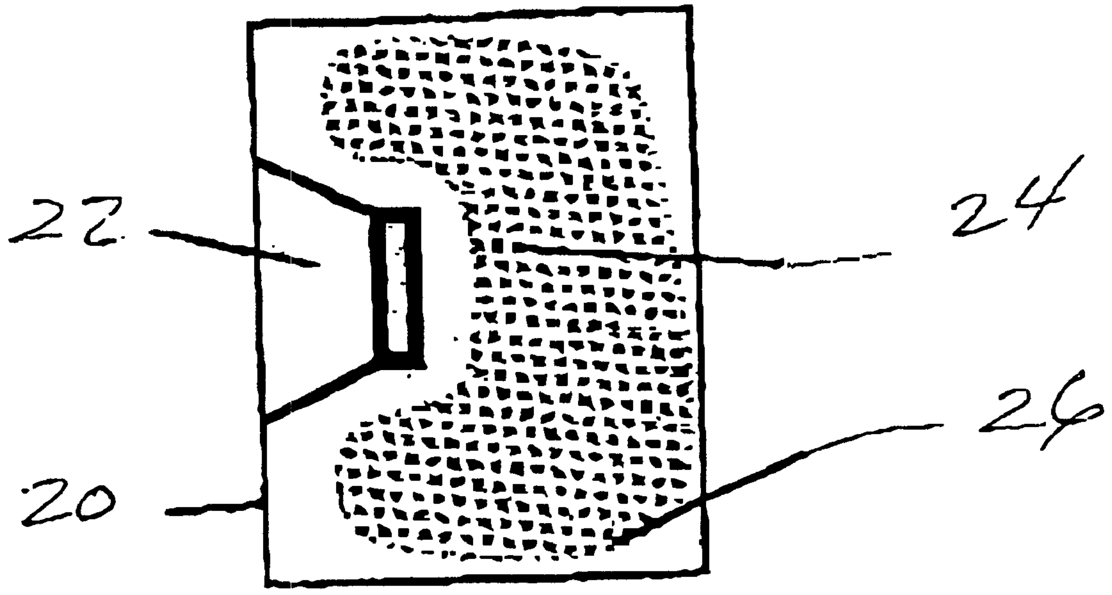
FIG. 3 is a cross-section of a typical loudspeaker with the kapok material positioned therein.

Referring to FIG. 3, a loudspeaker box 20, having a loudspeaker driver 22, is filled with kapok material 24 with porous material 26 used to pack it. This is particularly true for a posted box, i.e. a vented box system and transmission line system. Kapok can be used together with other damping materials such as thin foam or DACRON™ positioned at the back side of the loudspeaker, etc.

It will be appreciated by those skilled in the art that the material may be used in any form of loudspeaker enclosure as set forth herein previously.

Although embodiments of the invention have been described above, it is not limited thereto and it will be apparent to those skilled in the art that numerous modifications form part of the present invention insofar as they do not depart from the spirit, nature and scope of the claimed and described invention.

TABLE 1

SPL COMPARISON BETWEEN KAPOK, FIBERGLASS, DACRON ™, ACOUSTIC FOAM AND NO FILL

| FRE-QUENCY | NO FILL | FIBER-GLASS | DA-CRON ™ | ACOU-STICAL FOAM | Kapok |
|---|---|---|---|---|---|
| 60 Hz | 70.98 dB | 73.95 dB | 75.72 dB | 76.71 dB | 78.57 dB |
| 65 Hz | 71.39 dB | 77.92 dB | 78.45 dB | 79.46 dB | 80.81 dB |
| 70 Hz | 73.71 dB | 81.30 dB | 79.72 dB | 80.65 dB | 81.72 dB |
| 80 Hz | 84.74 dB | 84.89 dB | 84.33 dB | 84.83 dB | 84.91 dB |
| 90 Hz | 87.22 dB | 86.53 dB | 86.06 dB | 86.44 dB | 86.24 dB |
| 100 Hz | 88.02 dB | 87.36 dB | 86.86 dB | 87.26 dB | 86.96 dB |

TABLE 2

SPL DIFFERENCE BETWEEN KAPOK, FIBERGLASS, DACRON ™, ACOUSTIC FOAM AND NO FILL

| FREQUENCY | KG | KA | KD | KN |
|---|---|---|---|---|
| 60 Hz | 4.62 dB | 1.86 dB | 2.85 dB | 7.59 dB |
| 65 Hz | 2.89 dB | 1.35 dB | 2.36 dB | 9.42 dB |
| 70 Hz | 0.42 dB | 1.07 dB | 2.00 dB | 8.01 dB |
| 80 Hz | 0.02 dB | 0.08 dB | 0.58 dB | 0.17 dB |
| 90 Hz | −0.29 dB | −0.20 dB | 0.18 dB | −0.98 dB |
| 100 Hz | −0.40 dB | −0.30 dB | 0.10 dB | −1.06 dB |

NOTE:
KG = The SPL difference between kapok and fiberglass
KA = The SPL difference between kapok and acoustic foam
KD = The SPL difference between kapok and DACRON ™
KN = The SPL difference between kapok and no fill

TABLE 3

FREQUENCIES FOR DIFFERENT MATERIALS

| DAMPING MATERIAL | FL | FH | FM | Ro |
|---|---|---|---|---|
| No Fill | 39.6 Hz | 92.7 Hz | 70.4 Hz | 4.2 Ohm |
| Dacron ™ | 35.8 Hz | 90.5 Hz | 60.6 Hz | 5.3 Ohm |
| Acoustic Foam | 37.2 Hz | 90.5 Hz | 60.6 Hz | 4.9 Ohm |
| Fiberglass | 36.7 Hz | 90.5 Hz | 62.2 Hz | 4.9 Ohm |
| Kapok | 34.9 Hz | 84.9 Hz | 54.8 Hz | 4.9 Ohm |

We claim:

1. Sound attenuating material for use in a loudspeaker enclosure, comprising:

kapok material, said kapok for reducing enclosure resonance and driver resonance said kapok material being present in a density of between 2.2 $gl^{-1}$ and 20.5 $gl^{-1}$ for reducing enclosure resonance and driver resonance.

2. The attenuating material as set forth in claim 1, wherein said kapok material is fibrous.

3. A loudspeaker enclosure having reduced internal resonance, comprising:

a loudspeaker enclosure having a plurality of walls forming an enclosure;

a loudspeaker driver mounted to one of said walls; and kapok material positioned within said enclosure for reducing internal frequency resonance of said enclosure and resonance of loudspeaker, said kapok material present in a density of between 2.2 $gl^{-1}$ and 20.5 $gl^{-1}$.

4. The enclosure as set forth in claim 3, wherein said enclosure further includes rag cloth material.

5. The enclosure as set forth in claim 4, wherein said kapok has a density of between 2.0 $gl^{-1}$ and 16.3 $gl^{-1}$.

6. The enclosure as set forth in claim 3, wherein said enclosure further includes acoustic foam.

7. The enclosure as set forth in claim 6, wherein said kapok has a density of between 1.3 $gl^{-1}$ and 11.8 $gl^{-1}$.

8. The enclosure as set forth in claim 3, wherein said enclosure further includes Dacron™.

9. The enclosure as set forth in claim 8, wherein said kapok has a density of between 1.1 $gl^{-1}$ and 10.3 $gl^{-1}$.

10. The enclosure as set forth in claim 3, further including at least one of rag cloth, fiberglass, Dacron™ and acoustic foam.

11. The enclosure as set forth in claim 3, wherein said loudspeaker driver comprises at least one of a sub-woofer, woofer, tweeter and midrange.

12. A method of reducing internal resonance in a loudspeaker enclosure, comprising:

providing a loudspeaker enclosure having a plurality of walls and at least one loudspeaker driver mounted therein;

providing kapok material; and positioning said kapok material within said enclosure in a density of between 2.2 $gl^{-1}$ and 20.5 $gl^{-1}$ whereby internal resonance of said enclosure is reduced relative to an enclosure absent said kapok material.

13. The method as set forth in claim 12, further including the step of positioning at least one of rag cloth, Dacron™, fiberglass and acoustic foam within said enclosure.

14. The method as set forth in claim 12, wherein said kapok material is positioned adjacent a wall of said enclosure opposite a wall wherein said loudspeaker driver is positioned.

* * * * *